United States Patent
Bu et al.

(10) Patent No.: US 11,455,824 B2
(45) Date of Patent: Sep. 27, 2022

(54) COVER PLATE AND MANUFACTURING METHOD THEREOF, ELECTRONIC DEVICE

(71) Applicant: BOE TECHNOLOGY GROUP CO., LTD., Beijing (CN)

(72) Inventors: Dejun Bu, Beijing (CN); Paoming Tsai, Beijing (CN); Jianwei Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 832 days.

(21) Appl. No.: 16/168,333

(22) Filed: Oct. 23, 2018

(65) Prior Publication Data
US 2019/0130158 A1 May 2, 2019

(30) Foreign Application Priority Data
Nov. 2, 2017 (CN) .......................... 201711064434.8

(51) Int. Cl.
G06V 40/13 (2022.01)
H05K 5/03 (2006.01)
G06F 3/042 (2006.01)
G06F 3/041 (2006.01)

(52) U.S. Cl.
CPC .......... *G06V 40/1324* (2022.01); *G06F 3/042* (2013.01); *G06F 3/0412* (2013.01); *G06V 40/13* (2022.01); *H05K 5/03* (2013.01); *G06V 40/1318* (2022.01)

(58) Field of Classification Search
None
See application file for complete search history.

(56) References Cited

U.S. PATENT DOCUMENTS

| 10,665,631 | B1* | 5/2020 | Cai | H01L 51/42 |
| 2012/0085822 | A1* | 4/2012 | Setlak | G06K 9/605 235/439 |
| 2016/0077622 | A1 | 3/2016 | Lee et al. | |
| 2018/0075278 | A1* | 3/2018 | Zhang | G06K 9/20 |
| 2018/0076268 | A1* | 3/2018 | Wang | H01L 27/1443 |
| 2018/0137337 | A1* | 5/2018 | Zeng | G06K 9/00013 |
| 2018/0260606 | A1 | 9/2018 | Wu et al. | |
| 2019/0056613 | A1* | 2/2019 | Wang | G06K 9/00046 |

(Continued)

FOREIGN PATENT DOCUMENTS

CN 104899585 A 9/2015
CN 204808251 U 11/2015
(Continued)

OTHER PUBLICATIONS

Chinese Office Action in Chinese Application No. 201711064434.8, dated May 8, 2019 with English translation.

*Primary Examiner* — Chikaodili E Anyikire
(74) *Attorney, Agent, or Firm* — Collard & Roe, P.C.

(57) ABSTRACT

A cover plate and a manufacturing method thereof, an electronic device are disclosed. The cover plate includes an operation area, the operation area includes an identification area and a non-identification area, the cover plate includes a contact surface, the contact surface includes a first contact surface and a second contact surface, the first contact surface is in the identification area, the second contact surface is in the non-identification area, and the first contact surface and the second contact surface have different contact properties.

15 Claims, 4 Drawing Sheets

(56) References Cited

U.S. PATENT DOCUMENTS

| | | | | |
|---|---|---|---|---|
| 2019/0073515 A1* | 3/2019 | Ryu | ................... | G02F 1/13338 |
| 2019/0102593 A1* | 4/2019 | Wang | ................... | G06K 9/0004 |
| 2019/0102595 A1* | 4/2019 | Lee | ................... | G06K 9/00067 |
| 2020/0074775 A1* | 3/2020 | Cole | ................... | G06K 9/00241 |
| 2020/0184174 A1* | 6/2020 | Song | ................... | G06K 9/0002 |

FOREIGN PATENT DOCUMENTS

| | | |
|---|---|---|
| CN | 105468186 A | 4/2016 |
| CN | 106101323 A | 11/2016 |
| WO | 2017/097145 A1 | 6/2017 |

* cited by examiner

COVER PLATE AND MANUFACTURING METHOD THEREOF, ELECTRONIC DEVICE

CROSS-REFERENCE TO RELATED APPLICATION

The present application claims priority of the Chinese patent application No. 201711064434.8, filed on Nov. 2, 2017, the disclosure of which is incorporated herein by reference as part of the application.

TECHNICAL FIELD

Embodiments of the present disclosure relate to a cover plate and a manufacturing method thereof, an electronic device.

BACKGROUND

In the intelligent terminal field, fingerprint recognition has been more and more widely used in electronic products due to its advantages such as high uniqueness, high stability, high accuracy, high security, high collect ability, low cost or the like. During the use of an electronic product, a user locates a fingerprint recognition area for operation. However, in an environment such as dim light or the like, it is difficult for the user to determine the exact location of the fingerprint recognition area, which may easily lead to operational errors and poor user experience.

SUMMARY

At least an embodiment of the present disclosure provides a cover plate, the cover plate comprises an operation area, the operation area comprises an identification area and a non-identification area, the cover plate comprises a contact surface, the contact surface comprises a first contact surface and a second contact surface, the first contact surface is in the identification area, the second contact surface is in the non-identification area, and the first contact surface and the second contact surface have different contact properties.

For example, the cover plate according to at least an embodiment of the present disclosure further comprises a coating layer configured to constitute the first contact surface and the second contact surface.

For example, in the cover plate according to at least an embodiment of the present disclosure, the contact properties comprise a surface roughness of the first contact surface and a surface roughness of the second contact surface, and the surface roughness of the first contact surface is different from the surface roughness of the second contact surface.

For example, in the cover plate according to at least an embodiment of the present disclosure, the contact properties comprise a smoothness of the first contact surface and a smoothness of the second contact surface, and the smoothness of the first contact surface is different from the smoothness of the second contact surface.

For example, in the cover plate according to at least an embodiment of the present disclosure, a lyophobic property of the first contact surface and a lyophobic property of the second contact surface are different such that the smoothness of the first contact surface and the smoothness of the second contact surface are different.

For example, in the cover plate according to at least an embodiment of the present disclosure, materials of the first contact surface and the second contact surface comprise halogen compound, a content of the halogen compound in the first contact surface is a first content, a content of the halogen compound in the second contact surface is a second content, and the first content is different from the second content such that the lyophobic property of the first contact surface and the lyophobic property of the second contact surface are different.

For example, the cover plate according to at least an embodiment of the present disclosure further comprises an optical matching layer, the optical matching layer is on a side opposite to a predetermined contact side of the contact surface and in the identification area or the non-identification area, and the optical matching layer is configured such that optical characteristics of the identification area and optical characteristics of the non-recognition area are substantially identical to each other.

For example, in the cover plate according to at least an embodiment of the present disclosure, the first contact surface and the second contact surface are in a same plane.

At least an embodiment of the present disclosure provides an electronic device, and the electronic device comprises the cover plate according to anyone of the embodiments of the present disclosure.

For example, in the electronic device according to at least an embodiment of the present disclosure, the identification area comprises a fingerprint identification area.

For example, the electronic device according to at least an embodiment of the present disclosure further comprises a display area or a touch area, and the operation area coincides with the display area or the touch area.

For example, the electronic device according to at least an embodiment of the present disclosure further comprises a display area or a touch area, and the operation area coincides with the display area or the touch area.

At least an embodiment of the present disclosure provides a manufacturing method of a cover plate, the cover plate comprising an operation area, the operation area comprising an identification area and a non-identification area, the method comprising: forming a contact surface of the cover plate; wherein the contact surface comprises a first contact surface and a second contact surface, the first contact surface is in the identification area, the second contact surface is in the non-identification area, and the first contact surface and the second contact surface have different contact properties.

For example, in the manufacturing method according to at least an embodiment of the present disclosure, wherein forming the contact surface comprises: forming a coating layer to provide the contact surface.

For example, in the manufacturing method according to at least an embodiment of the present disclosure, wherein the contact properties comprise a surface roughness of the first contact surface and a surface roughness of the second contact surface, and forming the coating layer comprises: etching the coating layer such that the surface roughness of the first contact surface is different from the surface roughness of the second contact surface.

For example, in the manufacturing method according to at least an embodiment of the present disclosure, wherein the contact properties comprise a smoothness of the first contact surface and a surface roughness of the second contact surface, and forming the coating layer comprises: forming the first contact surface and the second contact surface; wherein the first contact surface and the second contact surface are different in lyophobic properties such that the smoothness of the first contact surface and the second contact surface are different.

For example, in the manufacturing method according to at least an embodiment of the present disclosure, wherein forming the first contact surface and the second contact surface comprises: forming a first material layer in the identification area to form the first contact surface; and forming a second material layer in the non-identification area to form the second contact surface; wherein materials of the first contact surface and the second contact surface comprise halogen compound, a content of the halogen compound in the first contact surface is a first content, a content of the halogen compound in the second contact surface is a second content, and the first content is different from the second content such that the lyophobic property of the first contact surface and the lyophobic property of the second contact surface are different.

For example, the manufacturing method according to at least an embodiment of the present disclosure further comprising: forming an optical matching layer and forming the contact surface on the optical matching layer; wherein the optical matching layer is formed in the identification area or the non-identification area, and the optical matching layer is formed such that optical characteristics of the identification area and optical characteristics of the non-recognition area are substantially identical.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
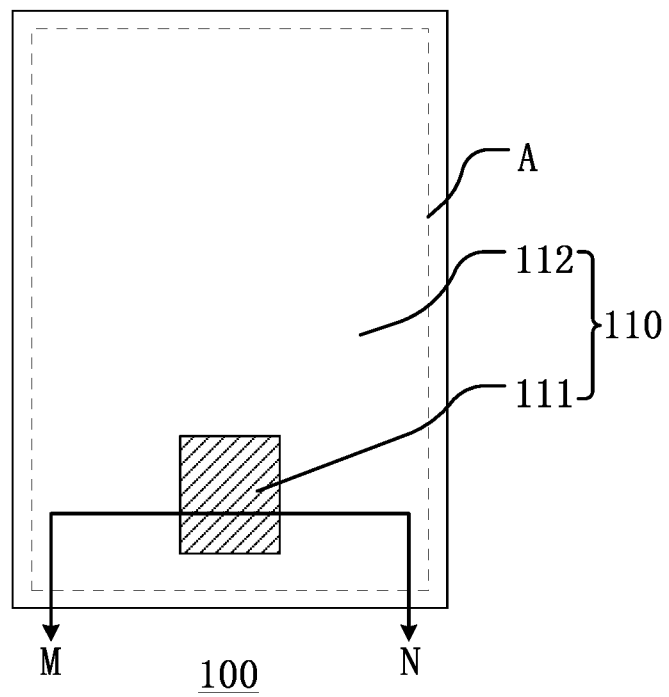
FIG. 1 is a plan view of a cover plate according to an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may comprise an electrical connection/coupling, directly or indirectly. The terms, "on," "under," "left," "right," or the like are only used to indicate relative position relationship, and when the position of the object which is described is changed, the relative position relationship may be changed accordingly.

At least an embodiment of the present disclosure provides a cover plate, the cover plate comprises an operation area, the operation area comprises an identification area and a non-identification area, the cover plate comprises a contact surface, the contact surface comprises a first contact surface and a second contact surface, the first contact surface is in the identification area, the second contact surface is in the non-identification area, and the first contact surface and the second contact surface have different contact properties. For example, in the event that the user touches the contact surface of the cover plate, the identification area can be accurately positioned by experiencing the difference between the contact properties of the first contact surface and the contact properties of the second contact surface. The positioning of the identification area in the cover plate is not limited by environmental conditions such as dim light, and this significantly improves the applicability of the cover plate.

In the following, a cover plate and a manufacturing method thereof, and an electronic device according to embodiments of the present disclosure are described with reference to the accompanying drawings.

Figure 2:
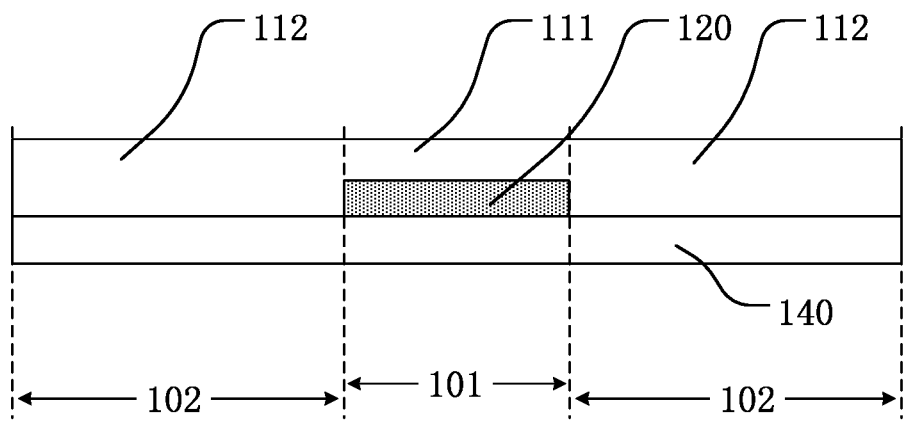
FIG. 2 is a cross-sectional view of the cover plate of FIG. 1 along line M-N.

At least an embodiment of the present disclosure provides a cover plate. FIG. 1 is a plan view of a cover plate according to an embodiment of the present disclosure, and FIG. 2 is a cross-sectional view of the cover plate of FIG. 1 along line M-N. For example, as illustrated in FIG. 1 and FIG. 2, the cover plate 100 comprises an operation area A (for example, the area defined by the broken line area in FIG. 1), and the operation area A comprises an identification area 101 and a non-identification area 102 on a side of the identification area 101. The contact surface 110 of the cover plate 100 comprises the first contact surface 111 in the identification area 101 and the second contact surface 112 in the non-recognition area 102, and the first contact surface 111 and the second contact surface 112 have different contact properties. The different contact properties between the first contact surface 111 and the second contact surface 112 allow a user to feel different touch sensations, and the user can accurately find the position of the recognition area 101 according to different touch sensations for operations such as fingerprint recognition.

For example, in at least one embodiment of the present disclosure, the cover plate comprises a coating layer configured to constitute the first contact surface and the second contact surface. For example, taking the coating layer as the contact surface of the cover plate as an example, as illustrated in FIG. 2, the cover plate 100 may comprise a base substrate 140, the coating layer is disposed on the substrate 140 and works as the contact surface 110 (comprising the first contact surface 111 and the second contact surface 112) of the cover plate 100. The base substrate 140 comprises a functional layer or a structural layer or the like, and according to different situations, the functional layer may comprise an identification circuit, a display circuit, or the like.

In at least one embodiment of the present disclosure, the positional relationship between the identification area and the non-identification area in the cover plate is not limited, which may be designed according to actual requirements. For example, the non-identification area may be located on a side of the identification area. For example, in some embodiments of the present disclosure, as illustrated in FIG. 1 and FIG. 2, the identification area 101 of the cover plate 100 is located within the non-identification area 102. For example, in some other embodiments of the present disclosure, the identification area of the cover plate is located at an edge of the non-identification area.

In at least one embodiment of the present disclosure, the range of the operation area in the cover plate is not limited and may be designed according to actual requirements. For example, the operation area A may be designed to correspond to a portion of the surface of the cover plate 100 as illustrated in FIG. 1; for example, the operation area A may also be designed to correspond to the entire surface of the cover plate 100.

In at least one embodiment of the present disclosure, the types of contact properties of the surface of the cover plate are not limited, for example, as long as a user is able to experience different touch sensations according to different contact properties. For example, the contact properties may comprise surface roughness, smoothness, thermal conductivity, or the like. In the following, in embodiments of the present disclosure, the types of contact properties are to be described.

For example, in a cover plate provided by at least one embodiment of the present disclosure, the contact properties may comprise the surface roughness of the first contact surface and the surface roughness of the second contact surface, and the surface roughness of the first contact surface is different from the surface roughness of the second contact surface. For instance, as illustrated in FIG. 1 and FIG. 2, the surface roughness of the first contact surface 111 is greater than the surface roughness of the second contact surface 112, or the surface roughness of the first contact surface 111 is less than the surface roughness of the second contact surface 112. For example, in a case where the user touches the contact surface 110, the dynamic friction (or sliding friction) coefficients of the different surface roughness are different, and correspondingly, the user perceives different friction feelings such that the identification area 101 of the cover plate 100 may be positioned.

In at least one embodiment of the present disclosure, the range of the surface roughness of the contact surface of the cover plate is not limited, which may be determined according to the application environment of the cover plate. For instance, as illustrated in FIG. 1, the cover plate 100 may be used in the display field, and if the surface roughness of the cover plate 100 is too large, the display effect may be adversely affected. Thereby, the surface roughness of the contact surface 110 of the cover plate 100 may be minimized such that the influence of the surface roughness on the display effect may be within an acceptable range, and the difference degree between the surface roughness of the first contact surface 111 and the surface roughness of the second contact surface 112 allows the user to perceive different friction feelings when touching the first contact surface 111 and the second contact surface 112. For example, the surface roughness of the contact surface of the cover plate has a surface roughness of 0.8 to 3.2 µm.

For example, in the cover plate provided by at least one embodiment of the present disclosure, the contact properties are smoothness, and the smoothness of the first contact surface and the smoothness of the second contact surface are different. For example, as illustrated in FIG. 1 and FIG. 2, the smoothness of the first contact surface 111 is greater than the smoothness of the second contact surface 112, or the smoothness of the first contact surface 111 is less than the smoothness of the second contact surface 112. The smoothness may be the smooth degree of sliding along the contact surface, and the smooth feelings of the user in an event that, for example, the finger of the user slides on the first contact surface 111 and the second contact surface 112 are different, such that the user can position the identification area of the cover plate 100.

Taking the finger of the user as an example, liquid (such as sweat, grease or the like) usually remains on the finger, and a kind of bonding effect occurs between the liquid and the contact surface of the cover plate. In a case where the bonding strength of the bonding effect is large, it is difficult for the finger to slide on the contact surface, the smooth feelings are poor, and correspondingly, the smoothness of the contact surface is small; in a case where the bonding strength of the bonding effect is small, it is easy for the finger to slide on the contact surface, the smooth feelings are good, and correspondingly, the smoothness of the contact surface is large.

For example, in the cover plate provided by at least one embodiment of the present disclosure, the wettability of the first contact surface and the wettability of the second contact surface are different such that the smoothness of the first contact surface and the second contact surface are different. For instance, as illustrated in FIG. 1 and FIG. 2, the wettability of the first contact surface 111 is greater than the wettability of the second contact surface 112 such that the smoothness of the first contact surface 111 is less than the smoothness of the second contact surface 112; or the wettability of the first contact surface 111 is less than the wettability of the second contact surface 112 such that the smoothness of the first contact surface 111 is greater than the smoothness of the second contact surface 112.

Factors affecting the magnitude of the bonding strength comprise adhesive force between the contact surface and the liquid, the wettability of the contact surface, or the like. The adhesive force is determined by the nature of the contact surface and the material of the liquid itself, and the adhesive force is not analyzed here. In a case where the wettability of the contact surface is large, the bonding strength is large, and correspondingly, the smoothness of the contact surface is small; in a case where the wettability of the contact surface is small, the bonding strength is small, and correspondingly, the smoothness of the contact surface large. Therefore, by changing the wettability of the contact surface, the bonding strength between the contact surface and the finger may be made different, that is, in a case where the wettability degrees of the different contact surfaces are different, the smoothness degrees of the contact surfaces are different.

For example, in at least one embodiment of the present disclosure, the lyophobic property of the first contact surface and the lyophobic property of the second contact surface are different such that the smoothness of the first contact surface and the smoothness of the second contact surface are different. For example, as illustrated in FIG. 1 and FIG. 2, the lyophobic property of the first contact surface 111 is larger than the lyophobic property of the second contact surface 112, thereby the smoothness of the first contact surface 111 is larger than the smoothness of the second contact surface 112; the lyophobic property of the first contact surface 111 is less than the lyophobic property of the second contact surface 112, thereby the smoothness of the first contact surface 111 is less than the smoothness of the second contact surface 112. In a case where the contact surface 110 has lyophobic property, the smoothness of the entire contact surface 110 is large, the smooth feelings of the user is good, and the first contact surface 111 and the second contact surface 112 have different lyophobic property such that the smoothness of the first contact surface 111 and the smoothness of the second contact surface 112 are different, thereby the user can position the identification area 101 accordingly.

The wettability of the contact surface comprises lyophilic property and lyophobic property, and the lyophilic property or the lyophobic property of the contact surface is related to the type of substances (for example, liquid) which are in contact with each other. There is surface tension on the surface of liquid, and surface energy exists on the surface of the contact surface. In a case where the surface energy is greater than the surface tension, the contact surface has lyophilic property to the liquid; and in a case where the surface energy is less than the surface tension, the contact surface has lyophobic property to the liquid. In a case where the surface energy of the contact surface is low, for example, so as to make the contact surface have lyophobic property, the liquid does not easily adhere to the contact surface, thereby the contact surface is less susceptible to contamination by foreign matters (such as sweat or the like), and the cleanliness degree of the contact surface of the cover plate can be significantly improved, and the contact surface can have a high degree of smoothness, which can enhance the user's experience.

In at least one embodiment of the present disclosure, the specific range of the lyophobic property of the contact surface is not limited. For instance, with water as a reference, in a case where the contact angle (water drop angle) of water on the contact surface of the cover plate is not less than 105 degrees, the contact surface has good lyophobic property, and the contact surface of the cover plate is difficult to keep contaminants such as fingerprints or the like, that is, the contact surface of the cover plate can have a good anti-fingerprint property.

In at least one embodiment of the present disclosure, the methods making the contact surface have a lyophobic property and making the first contact surface and the second contact surface have different lyophobic properties are not limited.

For example, in the cover plate provided by at least one embodiment of the present disclosure, a certain amount of a halogen compound may be doped or implanted into the contact surface to make the contact surface have a lyophobic property. For example, in the cover plate provided by at least one embodiment of the present disclosure, the materials of the first contact surface and the second contact surface comprise halogen compound, the content of the halogen compound in the first contact surface is a first content, the content of the halogen compound in the second contact surface is a second content, and the first content is different from the second content such that the lyophobic property of the first contact surface and the lyophobic property of the second contact surface are different. It should be noted that the above content can be expressed by way of mass percentage. For example, the first content is the ratio of the mass of the halogen compound in the first contact surface to the total mass of the first contact surface, and the second content is the ratio of the mass of the halogen compound in the second contact surface to the total mass of the second contact surface.

For example, as illustrated in FIG. 1 and FIG. 2, the first content of the halogen compound in the first contact surface 111 is larger than the second content of the halogen compound in the second contact surface 112, such that the lyophobic property of the first contact surface 111 is larger than the lyophobic property of the second contact surface 112; or the first content of the halogen compound in the first contact surface 111 is less than the second content of the halogen compound in the second contact surface 112, such that the lyophobic property of the first contact surface 111 is less than the lyophobic property of the second contact surface 112.

The method of obtaining the first contact surface and the second contact surface having different lyophobic properties may refer to relevant descriptions in the following embodiments (embodiments related to manufacturing method of the cover plate), which will not be repeated herein.

In at least one embodiment of the present disclosure, the types of halogen compounds doped in the contact surface are not limited. For example, the halogen compounds may comprise fluoride, chloride, bromide, iodide, and other halogen-containing polymers or the like. For example, the halogen compound may be calcium fluoride, magnesium fluoride or cesium fluoride or the like, or may be an organic group comprising halogen such as fluorine, chlorine, bromine, iodine or the like. For example, the halogen compound is fluoride, the organic group comprising fluorine may comprise perfluorpolyoxyalkyl polymer or modified silane of perfluorn polyethers or the like.

In at least one embodiment of the present disclosure, the contact properties of the first contact surface and the second contact surface of the cover plate are different, which may cause optical characteristics (such as light transmittance) of the identification area and the non-identification area of the cover plate to be different, and affect the uniformity of the light transmittance distribution of the cover plate. For example, in a case where the contact properties of the contact surface of the cover plate are surface roughness, the light transmittance of the area having a large surface roughness in the contact surface is low; and in a case where the contact properties of the contact surface of the cover plate are surface roughness, the light transmittance of the area of the contact surface doped a larger amount of the halogen compound is low.

For example, in at least one embodiment of the present disclosure, the cover plate further comprises an optical matching layer, which is on a side opposite to a predetermined contact side of the contact surface and in the identification area or the non-identification area. For example, as illustrated in FIG. 1 and FIG. 2, the predetermined contact side of the contact surface 110 may be a side of the contact surface 110 away from the base substrate 140, and the user may touch the contact surface 110 from the predetermined contact side. The predetermined contact side of the contact surface 110 may be a side of the contact surface 110 facing the base substrate 140.

For example, the optical matching layer is configured such that the optical characteristics of the identification area and the optical characteristics of the non-identification area are identical or substantially identical to each other. For example, the optical characteristics comprise light transmittance, the working light is incident from one side of the optical matching layer, and the optical matching layer is configured such that the light transmittance of the identification area and the light transmittance of the non-identification area are identical or substantially identical to each other. For example, the optical characteristics comprise light reflectivity, the working light is incident from the side of the contact surface (for example, the coating layer), and the optical matching layer is configured such that the light reflectivity of the identification area and the light reflectivity of the non-identification area are identical or substantially identical to each other. Hereinafter, the technical solution of at least one embodiment of the present disclosure is described by taking the optical characteristics as the light transmittance.

Figure 3:
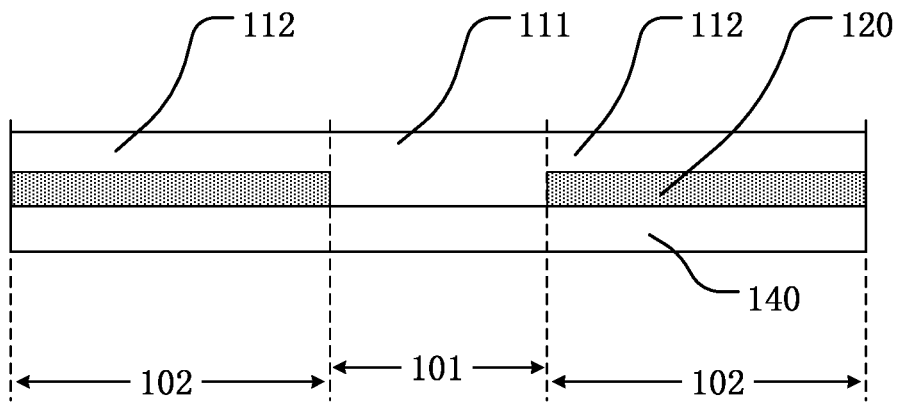
FIG. 3 is a cross-sectional view of another cover plate according to an embodiment of the present disclosure.

FIG. 3 is a cross-sectional view of another cover plate according to an embodiment of the present disclosure. For example, as illustrated in FIG. 2 and FIG. 3, the optical matching layer 120 is disposed on a side (the side of the contact surface 110 facing the base substrate 140) of the contact surface 110 opposite to the predetermined contact side. The optical matching layer 120 may be disposed in the identification area 101 as illustrated in FIG. 2, or may be disposed in the non-identification area 102 as illustrated in FIG. 3. In an actual application, the working light may be incident from the side of the cover plate on which the optical matching layer 120 is disposed. For example, by selecting and designing the thickness, material or the like of the optical matching layer 120, the light transmittance of the identification area 101 and the light transmittance of the non-identification area 102 of the cover plate are identical to each other.

The position at which the optical matching layer 120 is disposed is related to factors of the contact surface 110 such as the contact properties, materials of the optical matching layer 120, materials of the contact surface 110 or the like. Hereinafter, the method of disposing the optical matching layer 120 will be described by way of several embodiments.

For example, in at least one embodiment of the present disclosure, the contact property of the contact surface 110 is surface roughness. For example, in a case where the surface roughness of the first contact surface 111 is larger than the surface roughness of the second contact surface 112, if the light transmittance of the material of the optical matching layer 120 is larger than the light transmittance of the material of the contact surface 110, the optical matching layer 120 may be disposed in the identification area 101 as illustrated in FIG. 2; and if the light transmittance of the material of the optical matching layer 120 is less than the light transmittance of the material of the contact surface 110, the optical matching layer 120 may be disposed in the non-identification area 102 as illustrated in FIG. 3. For example, in a case where the surface roughness of the first contact surface 111 is less than the surface roughness of the second contact surface 112, if the light transmittance of the material of the optical matching layer 120 is less than the light transmittance of the material of the contact surface 110, the optical matching layer 120 may be disposed in the identification area 101 as illustrated in FIG. 2; and if the light transmittance of the material of the optical matching layer 120 is larger than the light transmittance of the material of the contact surface 110, the optical matching layer 120 may be disposed in the non-identification area 102 as illustrated in FIG. 3.

For example, in at least one embodiment of the present disclosure, the contact property of the contact surface 110 is smoothness. For example, in a case where the smoothness of the first contact surface 111 is larger than the smoothness of the second contact surface 112, if the light transmittance of the material of the optical matching layer 120 is larger than the light transmittance of the material of the contact surface 110, the optical matching layer 120 may be disposed in the identification area 101 as illustrated in FIG. 2; and if the light transmittance of the material of the optical matching layer 120 is less than the light transmittance of the material of the contact surface 110, the optical matching layer 120 may be disposed in the non-identification area 102 as illustrated in FIG. 3. For example, in a case where the smoothness of the first contact surface 111 is less than the smoothness of the second contact surface 112, if the light transmittance of the material of the optical matching layer 120 is less than the light transmittance of the material of the contact surface 110, the optical matching layer 120 may be disposed in the identification area 101 as illustrated in FIG. 2; and if the light transmittance of the material of the optical matching layer 120 is larger than the light transmittance of the material of the contact surface 110, the optical matching layer 120 may be disposed in the non-identification area 102 as illustrated in FIG. 3.

In at least one embodiment of the present disclosure, the materials of the contact surface of the cover plate are not limited. For example, the materials of the contact surface may comprise the materials having good light transmittance such as silicon oxide, silicon nitride or the like. For example, in at least one embodiment of the present disclosure, the materials of the contact surface of the cover plate may be doped with halogen compound to have lyophobic property.

In at least one embodiment of the present disclosure, the materials of the optical matching layer are not limited. For example, the materials of the optical matching layer may comprise one or any combination of the materials having good light transmittance such as silicon oxide, silicon nitride or the like.

In at least one embodiment of the present disclosure, the contact surfaces of the identification area and the non-identification area may be coplanar with each other. For example, in at least one embodiment of the present disclosure, the first contact surface and the second contact surface are in a same plane. The plane may be a flat surface (the surface is in a same horizontal plane), a curved surface or a plane of another shape, and the specific shape of the plane is designed according to the application environment of the cover plate and is not limited herein in the embodiments of the present disclosure. For example, as illustrated in FIG. 2 and FIG. 3, the thickness of the identification area 101 and the non-identification area 102 are substantially equal in the direction perpendicular to the substrate 140, and the surfaces of the contact surface 110 away from the base substrate 140 are substantially in a same plane. Therefore, the uniformity of the thickness of the cover plate can be ensured, and the user experience is improved.

As illustrated in FIG. 2 and FIG. 3, a base substrate 140 may be disposed in the cover plate to support the contact surface 110. In the embodiments of the present disclosure, materials of the substrate 140 are not limited. For example, the materials of the substrate may comprise good light transmissive materials such as glass, polyimide, polymethyl methacrylate, or the like. For example, in some embodiments of the present disclosure, the base substrate 140 may be configured as a rigid structure. For example, in some embodiments of the present disclosure, the base substrate may be configured as a flexible structure such that the cover plate can be used in a flexible electronic device such as a flexible display panel.

Figure 4:
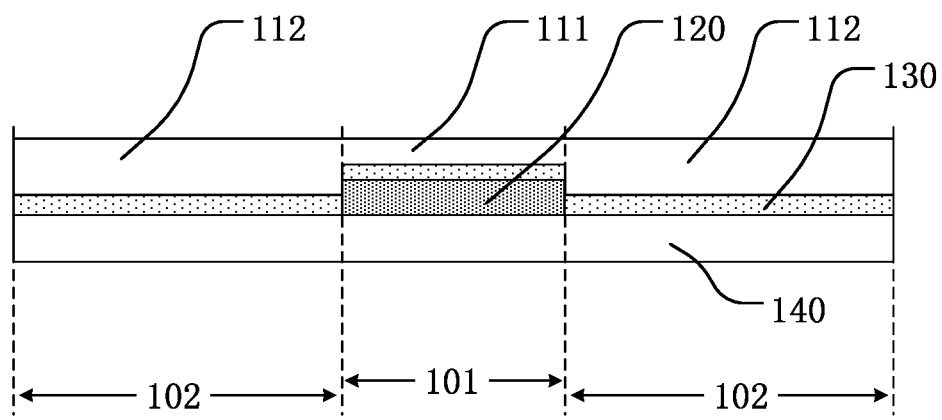
FIG. 4 is a cross-sectional view of still another cover plate according to an embodiment of the present disclosure.

For example, in at least one embodiment of the present disclosure, the cover plate may further comprise a transition layer disposed on a side of the contact surface opposite to the predetermined contact side. FIG. 4 is a cross-sectional view of another cover plate according to an embodiment of the present disclosure. For example, as illustrated in FIG. 4, the transition layer 130 may be disposed between the base substrate 140 and the contact surface 110. The transition layer 130 may function to connect the contact surface 110 and the base substrate 140 to avoid the case that the material of the contact surface 110 and the material of the base substrate 140 mismatch each other such that the contact surface 110 is separated from the substrate 140. In addition, in the case where the transition layer 130 is formed on the optical matching layer 120, the transition layer 130 may also have function of flattening or planarization, thereby making it easier for the cover plate to have a flat surface.

For example, the materials of the base substrate 140 may be glass, the materials for the transition layer 130 may comprise a silicon oxide material, and the materials for the contact surface 110 comprise silicon oxide doped with halogen compound. Therefore, the transition layer 130 may be tightly connected to the substrate 140, and the transition layer 130 may also be in intimate contact with the contact surface 110, which avoid the case that the base substrate 140 and the contact surface 110 are separated due to the difference between the type of the materials of the base substrate 140 and the type of the materials of the contact surface 110.

In at least one embodiment of the present disclosure, the distribution range of the transition layer is not limited. For example, on the surface of the contact surface facing the base substrate, the transition layer may be disposed in the area where the optical matching layer is not provided; or, as illustrated in FIG. 4, the transition layer 130 may also be disposed to cover all the contact surface 110.

In at least one embodiment of the present disclosure, the thickness of each layer structure in the cover plate is not limited. For example, in the embodiments shown in FIG. 4, the thickness of the optical matching layer 120 may be about 10 to 300 nm; and the thickness of the contact surface 110 (for example, a coating layer) may be about 2 to 20 nm. In a case where the transition layer 130 is provided, the thickness of the transition layer 130 may be 10 to 300 nm. For example, the thickness of the transition layer 130 located in the identification area 101 and the thickness of the transition layer 130 located in the non-identification area 102 are not limited to be substantially uniform as illustrated in FIG. 4; and the transition layer 130 may also be designed to planarize the surface of the cover plate, that is, the surface of the transition layer 130 away from the base substrate 140 is substantially planar. For example, in the area where the optical matching layer 120 is disposed (for example, the identification area 101 as illustrated in FIG. 4), the thickness of the transition layer 130 may be 10 to 100 nm, and in the area where the optical matching layer 120 is not disposed (for example, the non-identification area 102 as illustrated in FIG. 4), the thickness of the transition layer 130 may be 10 to 300 nm.

Figure 5:
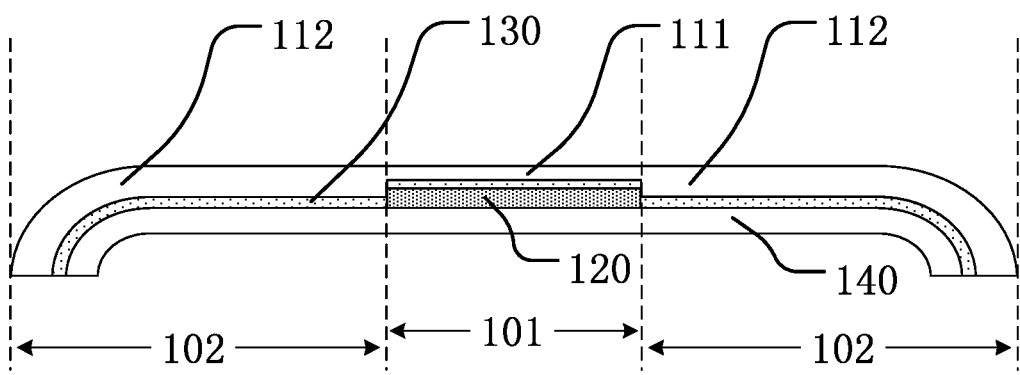
FIG. 5 is a cross-sectional view of further still another cover plate according to an embodiment of the present disclosure.

In at least one embodiment of the present disclosure, the outer shape of the cover is not limited and may be determined according to the actual application of the cover plate. For example, the outer shape of the cover plate may be a 2D shape as illustrated in FIG. 4, or may be a 2.5D shape or a 3D shape. FIG. 5 is a cross-sectional view of another cover plate according to an embodiment of the present disclosure. For example, in at least one embodiment of the present disclosure, as illustrated in FIG. 5, the edge of the cover 100 is curved such that the shape of the cover plate 100 is a 3D shape.

At least one embodiment of the present disclosure provides an electronic device, and the electronic device comprises the cover plate according to anyone of the embodiments of the present disclosure. In the embodiments of the present disclosure, the type of the electronic device is not limited. For example, the electronic device may be a display panel, a touch panel, or the like, and may further be any product or component with identification function such as a television, a display, a notebook computer, a digital photo frame, a navigator, an access control equipment or the like.

For example, in the electronic device provided by at least one embodiment of the present disclosure, the electronic device may further comprise a display area or a touch area, and the operation area coincides with the display area or the touch area. For example, the electronic device may be a display panel, and the cover plate is disposed on the display surface of the display panel. The operation area of the cover plate corresponds to a display area of the display panel, that is, the operation area of the cover plate coincides with the display area of the display panel. Or, for example, the electronic device may be a touch panel, and the cover plate is disposed on the touch panel. The operation area of the cover plate corresponds to a touch area of the touch panel, that is, the operation area of the cover plate coincides with the touch area of the touch panel.

For example, in the electronic device provided by at least one embodiment of the present disclosure, the identification area in the cover plate may comprise a fingerprint identification area. The user can accurately locate the fingerprint identification area through the cover plate to perform operations such as unlocking system related to identity authentication, or the like.

For example, in at least one embodiment of the present disclosure, the contact surface of the cover plate may be configured to have anti-fingerprint properties. For example, the coating layer that is used to constitute the contact surface 110 in FIG. 2 may be configured as an anti-fingerprint coating layer. Therefore, the residual amount of sweat on the user's finger on the cover plate can be reduced, and the cleanliness of the surface of the electronic device can be improved. For example, the coating layer has a lyophobic property corresponding to the liquid on the user's finger (for example, sweat, grease or the like). The method of making the contact surface 110 have a lyophobic property may refer to relevant description in the embodiments of FIG. 2 (the embodiments in which the contact properties of the contact surface are smoothness), which will not be described in the embodiments of the present disclosure herein.

Figure 6:
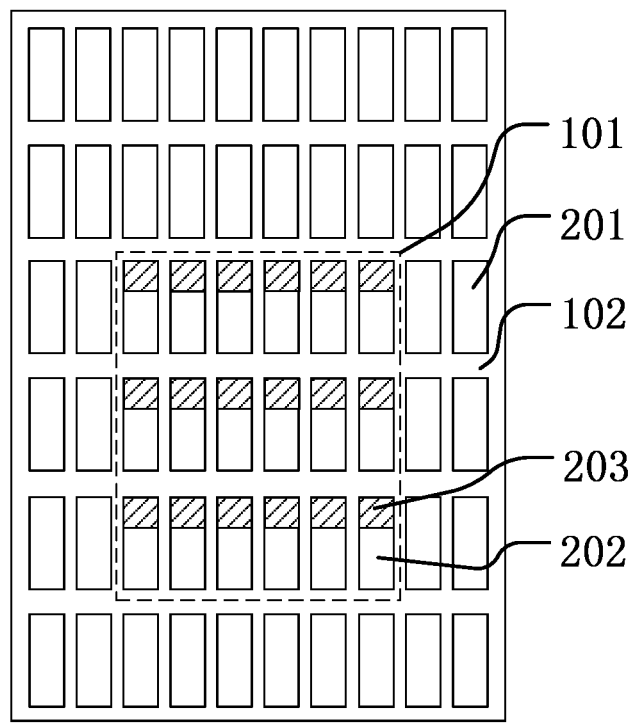
FIG. 6 is a schematic diagram showing a partial structure of an electronic device according to an embodiment of the present disclosure.

The structure, the location distribution, or the like of the identification area in the electronic device are related to the type of the electronic device, which will not be limited in at least one embodiment of the present disclosure herein. FIG. 6 is a schematic diagram showing a partial structure of an electronic device according to an embodiment of the present disclosure. Hereinafter, the technical solution in at least one embodiment of the present disclosure will be described by taking the electronic device as a display panel as an example.

For example, as illustrated in FIG. 6, the partial structure of the electronic device corresponds to a partial display area of the display panel. The display area comprises a plurality of sub-pixel areas. For example, in the area of the display panel corresponding to the non-identification area 102, each of the sub-pixel areas may comprise one sub-pixel unit 201; and in the area of the display panel corresponding to the identification area 101, each of the sub-pixel areas may comprise one sub-pixel unit 201 and at least one fingerprint identification sub-pixel unit 203. The fingerprint identification sub-pixel unit 203 may be disposed in an array in the identification area 101 of the display panel, and in a case where the user's fingers are positioned in the identification area 101 through the cover plate, the fingerprint identification sub-pixel unit 203 can detect the fingerprint of the user to implement operations such as unlocking, identity verification or the like.

In at least one embodiment of the present disclosure, the type of the fingerprint identification sub-pixel unit 203 as illustrated in FIG. 6 is not limited. For example, the fingerprint identification sub-pixel unit may be a capacitive sensor, an optical sensor, an ultrasonic sensor or the like.

At least one embodiment of the present disclosure provides a manufacturing method of a cover plate, the cover plate comprises an operation area, the operation area comprises an identification area and a non-identification area, and the method comprises: forming a contact surface of the cover plate. The contact surface comprises a first contact surface and a second contact surface, the first contact surface is in the identification area, the second contact surface is in the non-identification area, and the first contact surface and the second contact surface have different contact properties. For example, the non-identification area is located on a side of the identification area. The cover plate obtained by the above method can make the user's positioning of the identification area in the cover plate not be adversely affected by the environmental conditions such as dim light, which significantly improves the applicability of the cover plate.

For example, in the manufacturing method according to one embodiment of the present disclosure, forming the contact surface comprises: forming a coating layer to provide the contact surface. By treating the coating layer, the contact properties of the first contact surface and the second contact surface of the contact surface may be different.

For example, in the manufacturing method according to one embodiment of the present disclosure, the contact properties comprise a surface roughness of the first contact surface and a surface roughness of the second contact surface, and forming the coating layer comprises: etching the coating layer such that the surface roughness of the first contact surface is different from the surface roughness of the second contact surface. Different surface roughness can provide different friction feelings for the user such that the identification area of the cover plate may be positioned.

For example, in the manufacturing method according to one embodiment of the present disclosure, the contact properties comprise a smoothness of the first contact surface and a surface roughness of the second contact surface, and forming the coating layer comprises: forming the first contact surface and the second contact surface whereby the first contact surface and the second contact surface are different in lyophobic properties such that the smoothness of the first contact surface and the smoothness of the second contact surface are different. The different smoothness makes the user have different smooth feelings when his or her finger is sliding on the contact surface such that the identification area of the cover plate can be positioned.

For example, in the manufacturing method according to one embodiment of the present disclosure, forming the first contact surface and the second contact surface comprises: forming a first material layer in the identification area to form the first contact surface and forming a second material layer in the non-identification area to form the second contact surface. The materials of the first contact surface and the second contact surface comprise halogen compound, the content of the halogen compound in the first contact surface is a first content, the content of the halogen compound in the second contact surface is a second content, and the first content is different from the second content such that the lyophobic property of the first contact surface and the lyophobic property of the second contact surface are different. The contact surface having a lyophobic property may reduce the contamination of foreign matters such as sweat or the like so as to improve the cleanliness of the surface of the cover plate, and the different lyophobic properties make the user feel different smoothness, such that the identification area can be positioned. It should be noted that the above content may be a mass percentage content. For example, the first content is a ratio of the mass of the halogen compound in the first contact surface to the total mass of the first contact surface.

For example, the manufacturing method according to at least an embodiment of the present disclosure further comprises: forming an optical matching layer and forming the contact surface on the optical matching layer. The optical matching layer is formed in the identification area or the non-identification area, and the optical matching layer is formed such that optical characteristics of the identification area and optical characteristics of the non-recognition area are substantially identical. For example, the optical matching layer can make the distribution of the light transmittance or the light reflectivity of each portion of the cover plate uniform.

The specific structure of the cover plate obtained by the above method may refer to relevant description in the above embodiments (the embodiments of the cover plate), which will not be described in the embodiments of the present disclosure herein.

Figure 7A:
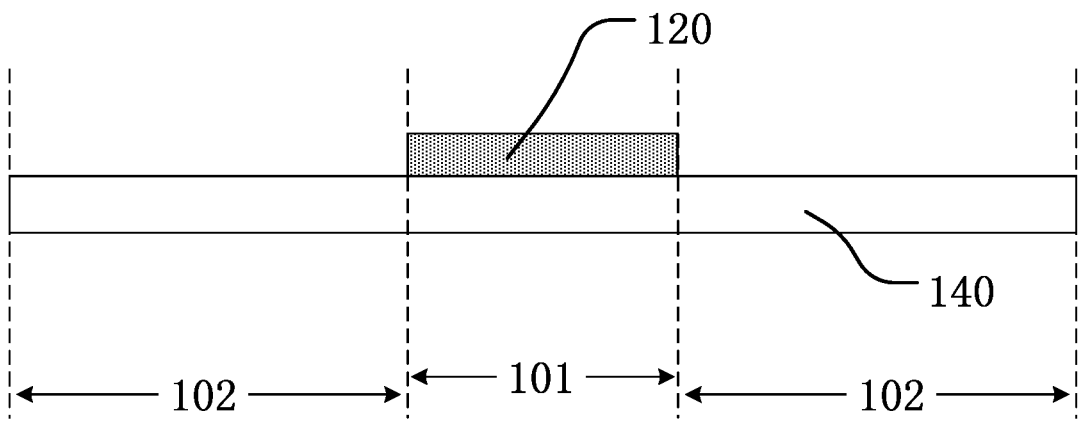
FIG. 7A to FIG. 7C are process diagrams of a method of manufacturing a cover plate according to an embodiment of the present disclosure.
Figure 7B:
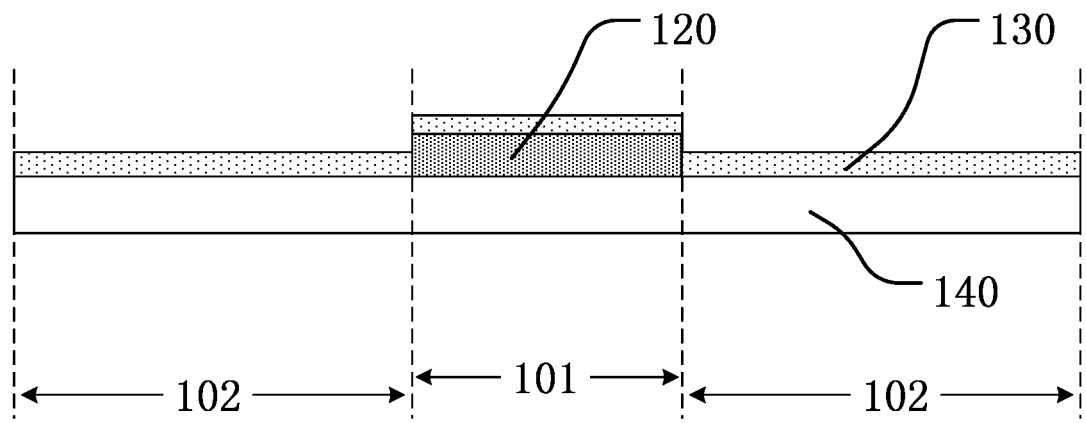
Figure 7C:
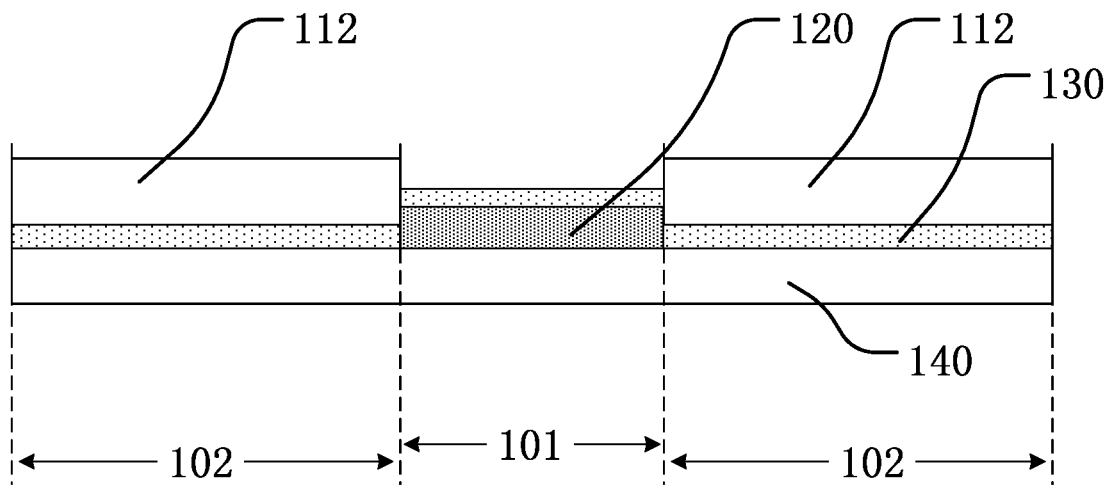

FIG. 7A to FIG. 7C are process diagrams of a method of manufacturing a cover plate according to an embodiment of the present disclosure. Hereinafter, a method of manufacturing a cover plate provided by at least one embodiment of the present disclosure will be described by taking the cover plate structure shown in FIG. 4 as an example.

For example, as illustrated in FIG. 7A, providing a base substrate 140 is provided, and then light transmissive materials are deposited on the substrate 140 to form an optical matching layer 120 by a patterning process. Other functional layers and structural layers may be formed on the substrate 140 in advance, and the functional layers may comprise identification circuits, display circuits, or the like. The optical matching layer 120 may be formed in the identification area 101 or the non-identification area 102. The structure and materials of the optical matching layer 120 may refer to relevant description in the above embodiments (the embodiments of the cover plate), which will not be described in the embodiments of the present disclosure herein.

The patterning process may comprise a dry etching process or a wet etching process. For example, the specific process of the patterning process may comprise: coating a photoresist layer on the structural layer to be patterned, exposing the photoresist layer using a mask plate, and developing the exposed photoresist layer to obtain a photoresist pattern, etching the structural layer by using the photoresist pattern as an etching mask, and then optionally removing the photoresist pattern.

It should be noted that the optical matching layer 120 may also be formed on the base substrate 140 by other methods such as coating process, vacuum coating process or the like.

For example, as illustrated in FIG. 7B, a light transmissive material is deposited on the base substrate 140 to form the transition layer 130. The structure and materials of the transition layer 130 may refer to relevant description in the above embodiments (the embodiments of the cover plate), which will not be described in the embodiments of the present disclosure herein.

The transition layer 130 can increase firmness of the adhesion between the contact surface 110 (for example, the coating layer) and the base substrate 140. The same or similar types of materials are easily crystallized. For example, the base substrate 140 is a glass substrate, and the materials of the transition layer 130 may comprise silicon oxide for example. In a case where the materials of the contact surface comprise silicon oxide or silicon nitride, the contact surface can be firmly attached on the base substrate 140 through the transition layer 120.

The transition layer 130 may be used to prevent the base substrate 140 and the contact surface 110 from separating from each other due to the type difference between the materials of the base substrate 140 and the materials of the contact surface 110. In a case where the bonding between the materials of the contact surface 110 and the materials of the base substrate 140 is tight, it may not be necessary to dispose the transition layer 130.

The contact properties of the contact surfaces of the cover plate may comprise surface roughness, smoothness, or the like, and correspondingly, the structure and the manufacturing method of the cover plate are also different. Hereinafter, the method of manufacturing the cover plate in at least an embodiment of the present disclosure will be described by taking the contact properties of the contact surface of the cover plate as smoothness as an example.

For example, as illustrated in FIG. 7C, a second material layer is formed on the base substrate 140 in the non-identification area 102 to form the second contact surface 112. There are a plurality of methods for manufacturing the second contact surface 112.

For example, the second material layer may be a kind of liquid (or paste) for coating, and the liquid is applied on the base substrate 140, so as to form the second contact surface 112 by a patterning process after baking and drying. The baking time and temperature may be set according to the actual situation, for example, which may be baked at a temperature of about 50 degrees Celsius for about 1 hour, and kept clean during baking to prevent foreign matter from adhering to ensure quality.

In at least one embodiment of the present disclosure, the specific composition of the liquid for coating is not limited. For example, the liquid for coating may comprise halogen compound, for example, the halogen compound may be fluorine-modified organic polymer or the like. The fluorine-modified organic polymer comprise reactive silane group or fluorine-modified organic group, or the like, such as perfluorpolyoxyalkyl polymer or modified silane of perfluom polyethers, and the mass percentage may be about 1 to 10%. For example, the liquid for coating may further comprise one or any combination of the following materials. (1) A curable hard coat polymer which may comprise at least one of polysiloxane, polysilsesquioxane, polyurethane, acrylic resin, acrylic copolymer, cellulose ether and cellulose esters, and other water-insoluble materials such as polyethers, polyesters, polystyrenes, styrene-butadiene copolymers, acrylonitrile butadiene styrene copolymers, polysulfides and any mixtures thereof, or the like, for example, and the mass percentage may be about 20-40%. (2) An additive which may comprise at least one of antioxidant, wetting agent or other surfactant, UV stabilizer, defoaming agent or anti-foaming agent, anti-settling agent, viscosity modifier, or the like, and for example, the mass percentage may be no more than about 5%. (3) A non-volatile polymer binder, and for example, the mass percentage thereof may be about 0.02 to 5%. (4) A solvent comprises, for example, at least one of water, alcohol, ketone, ether, ester, aromatic compound, alkanes and analogues thereof, a mixture of alkanes and analogues thereof, or the like, and for example, the mass percentage thereof may be about 50 to 90%.

For example, the second contact surface 112 may be formed on the base substrate 140 of the non-identification area 102 by vacuum evaporation on the base substrate 140. The second contact surface 112 may be doped with halogen compound, and may also comprise silicon oxide or silicon nitride.

As illustrated in FIG. 4, a first material layer is formed on the base substrate 140 of the identification area 101 to form a first contact surface 111. The method of manufacturing the first contact surface 111 may refer to relevant descriptions in the embodiments of FIG. 7C, and the first material layer may also refer to the second material layer in the embodiments of FIG. 7C, which will not be described in the embodiments of the present disclosure herein.

For example, in the process of forming the first contact surface 111 and the second contact surface 112, the content of the halogen compound in the first contact surface 111 and the content of the halogen compound in the second contact surface 112 may be made different, such that the lyophobic property of one contact surface 111 is different from the lyophobic property of the second contact surface 112.

In the above examples, the first contact face 111 and the second contact face 112 are formed in different steps, but the order in which the first contact face 111 and the second contact face 112 are formed is not limited. Additionally, after forming the coating layer on the entire surface of, for example, the base substrate 140, a mask plate is provided or a mask layer (for example, a photoresist pattern) is formed on the coating layer. The coating layer is ion-implanted by using the mask plate or the mask layer, thereby simultaneously forming the first contact surface 111 and the second contact surface 112 having different surface contact properties (for example, lyophobic property).

It should be noted that, in at least one embodiment of the present disclosure, the contact properties of the contact surface of the cover plate may also be surface roughness. After the manufacturing process as illustrated in FIG. 7B, the contact surface 110 may be formed on the substrate 141 by a method of coating or vacuum evaporation. The surface of the contact surface is subjected to physical treatment (such as sand blasting) or chemical treatment (such as etching) such that the surface roughness of the first contact surface 111 in the identification area 101 and the surface roughness of the second contact surface 112 in the non-identification area 102 are different.

For the present disclosure, the following points should be noted:

(1) The accompanying drawings in the embodiments of the present disclosure only involve structures relevant to the embodiments of the present disclosure, and other structures may refer to the conventional design.

(2) For clarity, in the accompanying drawings of the embodiments of the present disclosure, the thickness of layers or regions is enlarged or reduced. That is, the accompanying drawings are not drawn according to actual scales.

(3) The embodiments of the present disclosure and the characteristics in the embodiments may be mutually combined without conflict.

The described above are only specific embodiments of the present disclosure, and the present disclosure is not limited thereto. The scope of the present disclosure is defined by the accompanying claims.

What is claimed is:

1. A cover plate, comprising an operation area, the operation area comprising an identification area and a non-identification area,
wherein the cover plate comprises a contact surface, the contact surface comprises a first contact surface and a second contact surface,
the first contact surface is in the identification area, the second contact surface is in the non-identification area, and
the first contact surface and the second contact surface have different contact properties;
the cover plate further comprises: an optical matching layer, which is on a side opposite to a predetermined contact side of the contact surface and is in the identification area or the non-identification area;
wherein the optical matching layer is configured such that optical characteristics of the identification area and optical characteristics of the non-recognition area are substantially identical to each other;
the contact properties comprise a smoothness of the first contact surface and a smoothness of the second contact surface, and
a lyophobic property of the first contact surface and a lyophobic property of the second contact surface are different such that the smoothness of the first contact surface and the smoothness of the second contact surface are different.

2. The cover plate according to claim 1, further comprising a coating layer configured to constitute the first contact surface and the second contact surface.

3. The cover plate according to claim 2, wherein the contact properties comprise a surface roughness of the first contact surface and a surface roughness of the second contact surface, and
the surface roughness of the first contact surface is different from the surface roughness of the second contact surface.

4. The cover plate according to claim 1, wherein the contact properties comprise a surface roughness of the first contact surface and a surface roughness of the second contact surface, and
the surface roughness of the first contact surface is different from the surface roughness of the second contact surface.

5. The cover plate according to claim 1, wherein materials of the first contact surface and the second contact surface comprise halogen compound,
a content of the halogen compound in the first contact surface is a first content, a content of the halogen compound in the second contact surface is a second content, and
the first content is different from the second content such that the lyophobic property of the first contact surface and the lyophobic property of the second contact surface are different.

6. The cover plate according to claim 1, wherein the first contact surface and the second contact surface are in a same plane.

7. An electronic device, comprising the cover plate according to claim 1.

8. The electronic device according to claim 7, wherein the identification area comprises a fingerprint identification area.

9. The electronic device according to claim 8, further comprising a display area or a touch area,
wherein the operation area coincides with the display area or the touch area.

10. The electronic device according to claim 7, further comprising a display area or a touch area,
wherein the operation area coincides with the display area or the touch area.

11. A method of manufacturing a cover plate, the cover plate comprising an operation area, the operation area comprising an identification area and a non-identification area, the method comprising:
forming a contact surface of the cover plate;
wherein the contact surface comprises a first contact surface and a second contact surface, the first contact surface is in the identification area, the second contact surface is in the non-identification area, and the first contact surface and the second contact surface have different contact properties;
wherein forming the contact surface comprises: forming a coating layer to provide the contact surface;
forming an optical matching layer and forming the contact surface on the optical matching layer;
wherein the optical matching layer is formed in the identification area or the non-identification area, and the optical matching layer is formed such that optical characteristics of the identification area and optical characteristics of the non-recognition area are substantially identical;
the contact properties comprise a smoothness of the first contact surface and a smoothness of the second contact surface, and forming the coating layer comprises:
forming the first contact surface and the second contact surface;
wherein the first contact surface and the second contact surface are different in lyophobic properties such that the smoothness of the first contact surface and the second contact surface are different.

12. The method according to claim 11, wherein the contact properties comprise a surface roughness of the first contact surface and a surface roughness of the second contact surface, and forming the coating layer comprises:
etching the coating layer such that the surface roughness of the first contact surface is different from the surface roughness of the second contact surface.

13. The method according to claim 11, wherein forming the first contact surface and the second contact surface comprises:
forming a first material layer in the identification area to form the first contact surface; and
forming a second material layer in the non-identification area to form the second contact surface;
wherein materials of the first contact surface and the second contact surface comprise halogen compound,
a content of the halogen compound in the first contact surface is a first content, a content of the halogen compound in the second contact surface is a second content, and
the first content is different from the second content such that the lyophobic property of the first contact surface and the lyophobic property of the second contact surface are different.

14. A cover plate, comprising an operation area, the operation area comprising an identification area and a non-identification area,
- wherein the cover plate comprises a contact surface, the contact surface comprises a first contact surface and a second contact surface,
- the first contact surface is in the identification area, the second contact surface is in the non-identification area, and
- the first contact surface and the second contact surface have different contact properties;
- the contact properties comprise a smoothness of the first contact surface and a smoothness of the second contact surface, and
- the smoothness of the first contact surface is different from the smoothness of the second contact surface; and
- a lyophobic property of the first contact surface and a lyophobic property of the second contact surface are different such that the smoothness of the first contact surface and the smoothness of the second contact surface are different.

15. A method of manufacturing a cover plate according to claim 14, wherein the method comprises:
- forming a contact surface of the cover plate;
- wherein the contact surface comprises a first contact surface and a second contact surface, the first contact surface is in the identification area, the second contact surface is in the non-identification area, and the first contact surface and the second contact surface have different contact properties;
- forming the contact surface comprises: forming a coating layer to provide the contact surface;
- the contact properties comprise a smoothness of the first contact surface and a surface roughness of the second contact surface, and forming the coating layer comprises: forming the first contact surface and the second contact surface; and the first contact surface and the second contact surface are different in lyophobic properties such that the smoothness of the first contact surface and the second contact surface are different.

* * * * *